United States Patent
Lim et al.

(10) Patent No.: US 7,060,573 B2
(45) Date of Patent: Jun. 13, 2006

(54) EXTENDED POLY BUFFER STI SCHEME

(75) Inventors: Victor Seng Keong Lim, Singapore (SG); Feng Chen, Singapore (SG); Lap Chan, San Francisco, CA (US); Wang Ling Goh, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 1433 days.

(21) Appl. No.: 09/759,909

(22) Filed: Jan. 16, 2001

(65) Prior Publication Data

US 2002/0094648 A1 Jul. 18, 2002

(51) Int. Cl.
*H01L 21/336* (2006.01)
(52) U.S. Cl. .................... 438/296; 438/435
(58) Field of Classification Search ............. 438/296, 438/424, 430, 435
See application file for complete search history.

(56) References Cited

U.S. PATENT DOCUMENTS

| | | | |
|---|---|---|---|
| 4,307,180 A | 12/1981 | Pogge | 430/314 |
| 5,229,316 A | 7/1993 | Lee et al. | 437/67 |
| 5,506,168 A | 4/1996 | Morita et al. | 437/67 |
| 5,712,185 A | 1/1998 | Tsai et al. | 437/67 |
| 5,837,612 A | 11/1998 | Ajuria et al. | 438/697 |
| 5,872,045 A | 2/1999 | Lou et al. | 438/432 |
| 6,080,637 A | 6/2000 | Huang et al. | 438/424 |
| 6,221,736 B1 * | 4/2001 | Gay | 438/435 |
| 6,281,082 B1 * | 8/2001 | Chen et al. | 438/296 |

OTHER PUBLICATIONS

US 5,006,482, 04/1991, Kerbaugh et al. (withdrawn)

* cited by examiner

*Primary Examiner*—Phuc T. Dang
(74) *Attorney, Agent, or Firm*—Saile Ackerman LLC; Stephen B. Ackerman; Rosemary L. S. Pike

(57) ABSTRACT

A new method of forming shallow trench isolations has been described. A silicon semiconductor substrate is provided. A silicon nitride layer is deposited overlying the substrate. A polysilicon layer is deposited overlying the silicon nitride layer. An oxidation mask is deposited overlying the polysilicon layer. The oxidation mask, polysilicon layer, silicon nitride layer, and the silicon semiconductor substrate are patterned to form trenches for planned shallow trench isolations. The silicon semiconductor substrate exposed within the trenches is oxidized to form an oxide liner layer within the trenches wherein the oxidation mask prevents oxidation of the polysilicon layer. Thereafter the oxidation mask is removed. A trench oxide layer is deposited overlying the liner oxide layer and filling the trenches. The trench oxide layer and the polysilicon layer are polished down stopping at the silicon nitride layer with a polishing selectivity of oxide to polysilicon to nitride of 4:100:1 wherein dishing is avoided to complete shallow trench isolations in the manufacture of an integrated circuit device.

31 Claims, 4 Drawing Sheets

EXTENDED POLY BUFFER STI SCHEME

BACKGROUND OF THE INVENTION (1) Field of the Invention

The invention relates to a method of fabricating semiconductor structures, and more particularly, to a method of forming planarized shallow trench isolation structures in the manufacture of integrated circuit devices.

(2) Description of the Prior Art

Shallow trench isolation (STI) is now commonly used in the art as an alternative to local oxidation of silicon (LOCOS) for forming isolations between active device areas in the integrated circuit. STI offers the advantages of smaller isolation area and better surface planarization when compared to LOCOS. However, the STI process suffers from dishing, especially over large trenches. Dishing can cause excessive device leakage in some cases. Currently, reverse masking and dummy active structures are the most commonly employed methods to prevent dishing during the STI chemical mechanical polishing (CMP) process. However, reverse masking steps incur additional processing costs. Dummy structures, on the other hand, cause an increase in parasitic capacitance that is not favorable, especially in mixed signal processes.

Co-pending U.S. patent application Ser. No. 09/443,449 to F. Chen, filed on Nov. 22, 1999, teaches a new technique for preventing dishing in an STI process. This technique makes use of a polysilicon layer over the silicon nitride. A CMP slurry having a polishing selectivity of oxide to polysilicon to nitride of 4:100:1 is used in polishing the trench oxide. The technique makes use of the humping effect of the polysilicon polishing to overcome the dishing effect when the nitride is exposed to result in a planarized trench oxide. The polysilicon buffer layer must not be too thin in order to compensate for the dishing effect. Unfortunately, due to etching constraints, the maximum polysilicon buffer thickness is about 1000 Angstroms. If the polysilicon is too thick, the etching aspect ratio is too large. At the end of the STI etch, the photoresist on top of the active area will be completely removed, causing the polysilicon buffer to be etched away during the silicon etch. In addition, if a liner oxidation step is performed, the polysilicon buffer layer will be reduced by half by this oxidation. It is desired to find a way to use this dishing compensation technique with a thick enough polysilicon buffer layer.

Several patents disclose STI processes. U.S. Pat. No. 5,506,168 to Morita et al teaches various methods of forming shallow trench isolation. One embodiment teaches a polysilicon buffer technique, but humping compensation for dishing is not disclosed. Protection of the polysilicon buffer layer is not taught. U.S. Pat. No. 5,712,185 to Tsai et al discloses an STI process in which a polysilicon or oxide layer is used to improve the STI recessed edge. This layer can be removed before CMP. U.S. Pat. No. 5,229,316 to Lee et al teaches a STI process where a sacrificial nitride layer is formed over a polysilicon layer. However, there is no polish stop layer underlying the polysilicon in this process. U.S. Pat. No. 5,837,612 to Ajuria et al teaches another STI process using a polysilicon layer as a polish stop. No silicon nitride is used in this process. U.S. Pat. No. 5,872,045 to Lou et al teaches filling a STI region with polysilicon. U.S. Pat. No. 5,006,482 to Kerbaugh et al teaches polysilicon over oxide and etchback. U.S. Pat. No. 4,307,180 to Pogge teaches a polysilicon layer and an etchback process to prevent dishing.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations where oxide dishing is eliminated.

Another object of the present invention is to provide a method to fabricate shallow trench isolations where the final thickness of the post-CMP silicon nitride is better controlled.

Yet another object of the invention is to provide a method to fabricate shallow trench isolations wherein oxide dishing is eliminated and the final thickness of the post-CMP silicon nitride is better controlled.

A further object of the invention is to provide a method to fabricate shallow trench isolations wherein oxide dishing is eliminated and the final thickness of the post-CMP silicon nitride is better controlled by the use of a polysilicon buffer layer.

A still further object of the invention is to provide a method to fabricate shallow trench isolations wherein oxide dishing is eliminated and the final thickness of the post-CMP silicon nitride is better controlled by the use of a polysilicon buffer layer wherein oxidation of the polysilicon buffer layer is prevented.

In accordance with the objects of this invention, a new method of forming shallow trench isolations has been achieved. A silicon semiconductor substrate is provided. A silicon nitride layer is deposited overlying the substrate. A polysilicon layer is deposited overlying the silicon nitride layer. An oxidation mask is deposited overlying the polysilicon layer. The oxidation mask, polysilicon layer, silicon nitride layer, and the silicon semiconductor substrate are patterned to form trenches for planned shallow trench isolations. The silicon semiconductor substrate exposed within the trenches is oxidized to form an oxide liner layer within the trenches wherein the oxidation mask prevents oxidation of the polysilicon layer. Thereafter the oxidation mask is removed. Alternatively, the oxidation mask may be removed during the subsequent polishing step. A trench oxide layer is deposited overlying the liner oxide layer and filling the trenches. The trench oxide layer and the polysilicon layer are polished down stopping at the silicon nitride layer with a polishing selectivity of oxide to polysilicon to nitride of 4:100:1 wherein dishing is avoided to complete shallow trench isolations in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention is an improvement over the co-pending U.S. patent application Ser. No. 09/443/449 to F. Chen. The present invention achieves the prevention of oxide dishing and uniformity control of the post-CMP nitride thickness as does the co-pending application. However, the present invention offers the further advantage of maintaining a maximal polysilicon buffer thickness even after liner oxidation.

Figure 1:
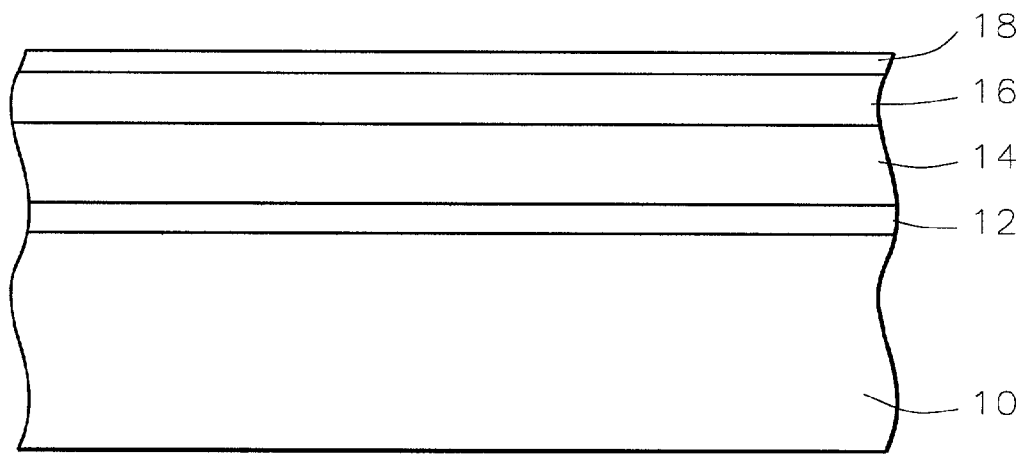
FIGS. 1 through 7 schematically illustrate in cross-sectional representation a preferred embodiment of the present invention.

Referring now more particularly to FIG. 1, there is shown a cross section of a partially completed integrated circuit device of the preferred embodiment. A semiconductor substrate 10, typically consisting of monocrystalline silicon, is provided. A pad oxide layer 12 is thermally grown on the surface of the substrate to a thickness of between about 80 and 200 Angstroms. A silicon nitride layer 14 is deposited overlying the pad oxide layer 12 by low-pressure chemical vapor deposition (LPCVD) to a thickness of between about 800 and 2000 Angstroms. The silicon nitride layer 14 will serve as a polishing stop for the subsequent chemical mechanical polishing (CMP).

A polysilicon layer 16 is deposited overlying the silicon nitride layer 14. The polysilicon layer 16 is a key feature of the present invention. The polysilicon buffer layer will cushion the effect of dishing during CMP. In order to serve this purpose effectively, the polysilicon layer must not be too thin. Due to etching constraints, the polysilicon layer may have a maximum thickness of about 1000 Angstroms. The polysilicon layer is deposited to a thickness of between about 500 and 1000 Angstroms. It is desired to protect this polysilicon buffer layer during subsequent oxidation so that the polysilicon layer is not reduced in thickness. Therefore, a thin layer of silicon nitride is deposited over the polysilicon layer 16 as an oxidation mask. The silicon nitride layer 18 is deposited to a thickness of between about 200 and 800 Angstroms.

Figure 2:
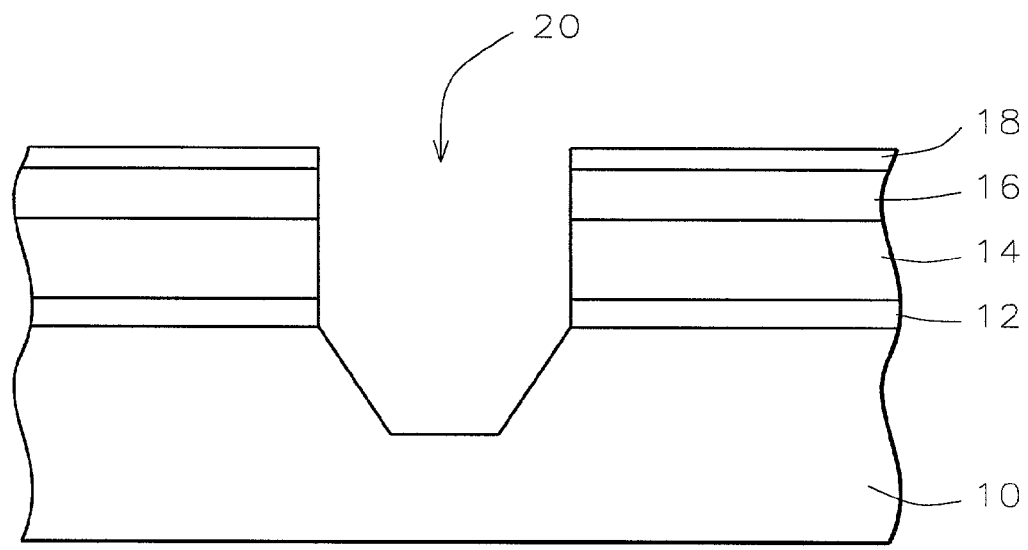

Referring now to FIG. 2, the silicon nitride layer 18, polysilicon layer 16, silicon nitride layer 14, pad oxide layer 12, and the semiconductor substrate 10 are patterned to form trenches 20 for planned shallow trench isolation regions. A conventional photolithographic process may be used to form a mask, not shown. A reactive ion etch (RIE) is performed to etch through each layer. The RIE process for the trench silicon etch and polysilicon etch comprises an etching chemistry of either a combination of HBr, $Cl_2$, and $O_2$ or a combination of $Cl_2$ and $O_2$. The RIE process for the nitride etch comprises an etching chemistry of either a combination of $CF_4$, $CHF_3$, Ar, He, and $O_2$ or a combination of $CF_4$, $CHF_3$, HBr, and $O_2$.

Figure 3:
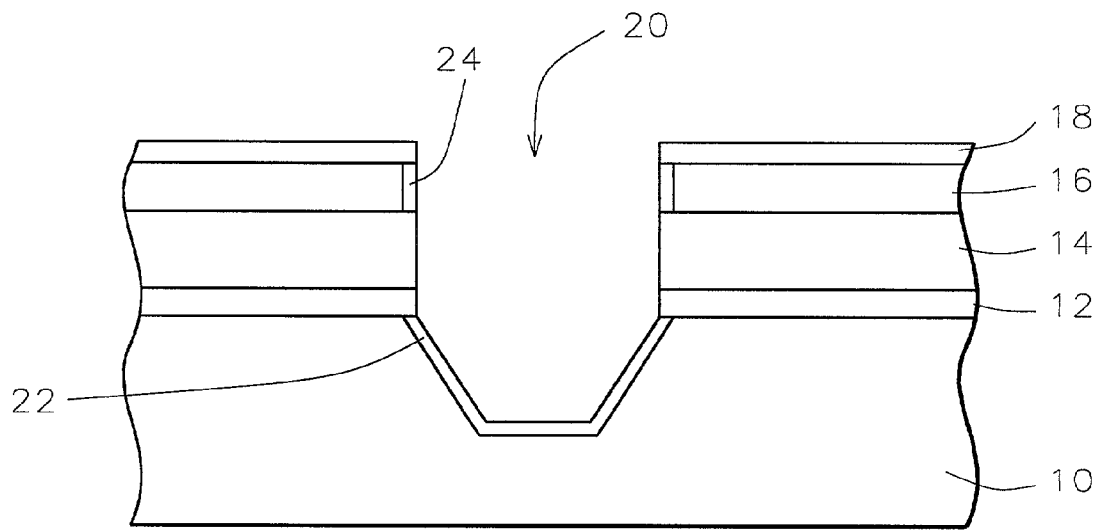

Referring now to FIG. 3, the silicon substrate exposed within the trench 20 is thermally oxidized to form a liner oxide layer 22 on the bottom and sidewalls of the trench. The liner oxide layer will have a thickness of between about 100 and 300 Angstroms. The sidewalls of the polysilicon layer 16 exposed within the trench are also oxidized 24. Since the rest of the polysilicon layer 16 is protected by the oxidation mask 18, the surface of the polysilicon layer 16 is not oxidized, so the layer retains its maximal thickness. The oxidation mask could now be removed, for example by a wet etch such as phosphoric acid.

Figure 4:
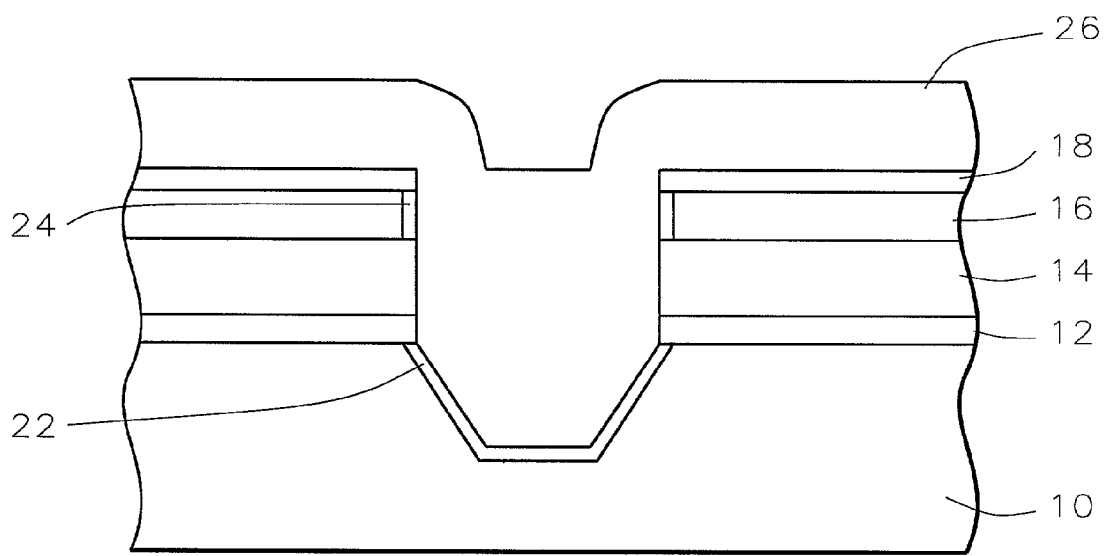

A trench oxide layer 26 is deposited overlying the oxidation mask 18 and filling the trenches, as illustrated in FIG. 4. The trench oxide layer 26 preferably comprises a high density plasma (HDP) silicon dioxide that will fill the trenches without creating voids or gaps. The trench oxide layer 26 is deposited to a thickness of between about 6,000 Angstroms and 8,000 Angstroms.

Now, a chemical mechanical polishing is performed. The preferable CMP slurry chemistry removes the polysilicon layer 16 more rapidly than the trench oxide layer 26. The preferred CMP slurry comprises either the combination of $NH_4OH$, silica abrasive, and de-ionized water or the combination of potassium hydroxide, silica abrasive, and de-ionized water. The CMP process pad comprises polyurethane. The preferred polishing selectivity of oxide to polysilicon to nitride is about 4:100:1. This means that oxide will be removed four times faster than nitride. Polysilicon will be removed 100 times faster than nitride and 25 times faster than oxide. This fact is used by the novel approach of the present invention to improve the STI process.

Figure 5:
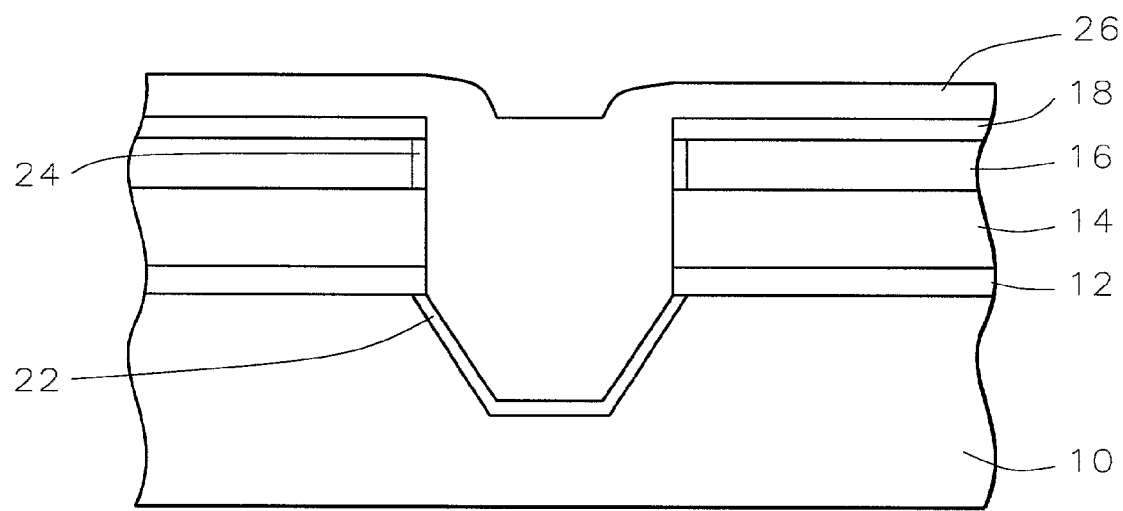

FIG. 5 illustrates a point in time during the CMP process before the CMP pad reaches the polysilicon layer 16. If the oxidation mask 18 is still overlying the polysilicon layer, it is removed by this CMP step. The CMP step will remove the oxide 26, oxidation mask 18, and polysilicon buffer 16 in one step.

Figure 6:
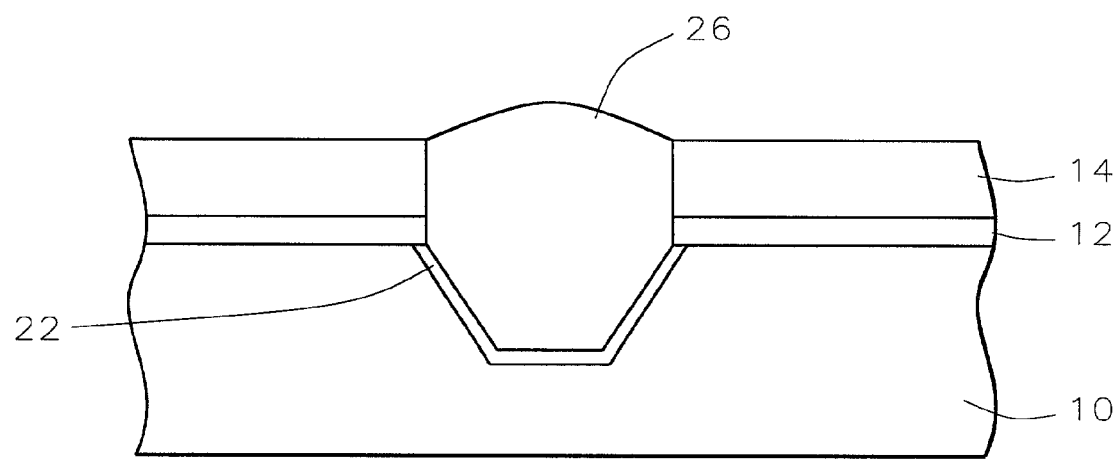
Figure 7:
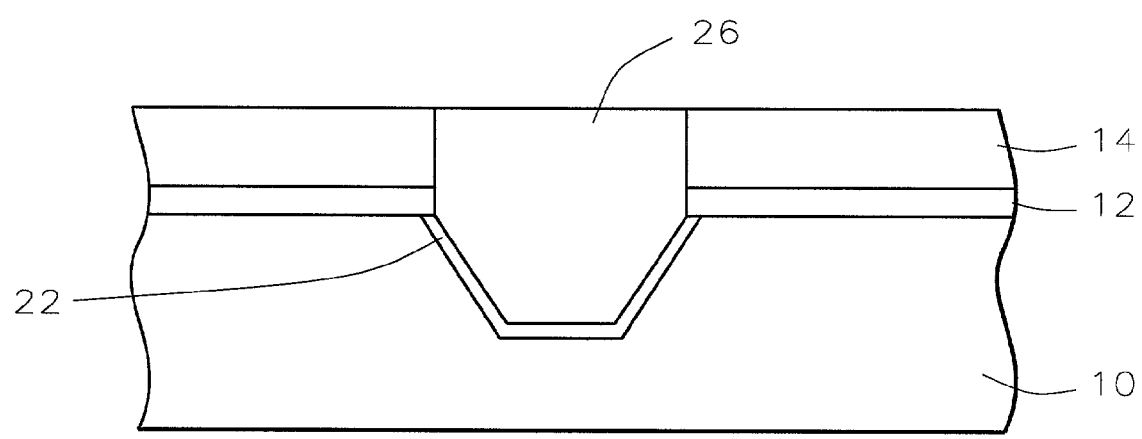

When the polysilicon layer 16 is reached, the polysilicon polishes away more quickly than the trench oxide, causing the oxide to have a concave formation, or a hump, as shown in FIG. 6. The underlying silicon nitride layer 14 is the polish stop layer. A short overpolishing is performed to remove all of the polysilicon layer 16 and flatten the trench oxide 26, as shown in FIG. 7. The dishing effect that occurs during the overpolish is compensated for by the humping effect of the polysilicon polishing. The result is a shallow trench isolation region with no dishing.

The process of the present invention forms shallow trench isolation regions without dishing and is effective even for wide trenches. The presence of the silicon nitride oxidation mask during liner oxidation insures the presence of the maximal thickness of the polysilicon layer. The high selectivity of the polish step in removing polysilicon much faster than silicon nitride makes it easy to clear all of the polysilicon layer with a minimum amount of silicon nitride overpolishing. This improves the uniformity of the final silicon nitride thickness.

While the invention has been particularly shown and described with reference to the preferred embodiments thereof, it will be understood by those skilled in the art that various changes in form and details may be made without departing from the spirit and scope of the invention.

What is claimed is:

1. A method to form shallow trench isolations in the manufacture of an integrated circuit device comprising:
   providing a silicon semiconductor substrate;
   depositing a silicon nitride layer overlying said silicon semiconductor substrate;
   depositing a polysilicon layer overlying said silicon nitride layer;
   depositing an oxidation mask overlying said polysilicon layer;
   patterning said oxidation mask, said polysilicon layer, said silicon nitride layer, and said silicon semiconductor substrate to form trenches for planned shallow trench isolations;
   oxidizing said silicon semiconductor substrate exposed within said trenches to form an oxide liner layer within said trenches wherein said oxidation mask prevents oxidation of said polysilicon layer;
   removing said oxidation mask;
   depositing a trench oxide layer overlying said oxide liner layer and filling said trenches; and
   polishing down said trench oxide layer and said polysilicon layer stopping at said silicon nitride layer to complete said shallow trench isolations in the manufacture of said integrated circuit device.

2. The method according to claim 1 further comprising forming a pad oxide layer having a thickness of between about 80 and 200 Angstroms underlying said silicon nitride layer.

3. The method according to claim 1 wherein said silicon nitride layer is deposited by chemical vapor deposition to a thickness of between about 800 and 2000 Angstroms.

4. The method according to claim 1 wherein said polysilicon layer is deposited to a thickness of between about 500 and 1000 Angstroms.

5. The method according to claim 1 wherein said oxidation mask comprises silicon nitride deposited by chemical vapor deposition to a thickness of between about 200 and 800 Angstroms.

6. The method according to claim 1 wherein said step of oxidizing said silicon semiconductor substrate forms said liner oxide layer having a thickness of between about 100 and 300 Angstroms.

7. The method according to claim 1 wherein said step of removing said oxidation mask comprises a wet etch before said step of depositing said trench oxide layer.

8. The method according to claim 1 wherein said oxidation mask is removed during said polishing down process.

9. The method according to claim 1 wherein said step of depositing said trench oxide layer comprises high density plasma chemical vapor deposition (HDP-CVD) of silicon oxide.

10. The method according to claim 1 wherein said polishing down is performed by a chemical mechanical polishing.

11. The method according to claim 10 wherein said chemical mechanical polishing uses a polishing slurry having a polishing selectivity of oxide to polysilicon to nitride of 4:100:1.

12. The method according to claim 1 wherein said trench oxide layer takes on a concave formation when said polysilicon layer is polished and wherein after said all of said polysilicon layer is removed an overpolishing flattens said trench oxide layer.

13. The method according to claim 10 wherein said chemical mechanical polishing uses a slurry comprising one of the group of: the combination of NH$_4$OH, silica abrasive, and de-ionized water and the combination of potassium hydroxide, silica abrasive, and de-ionized water; and wherein said chemical mechanical polishing process pad comprises polyurethane.

14. A method to form shallow trench isolations in the manufacture of an integrated circuit device comprising:
providing a silicon semiconductor substrate;
forming a pad oxide layer overlying said silicon semiconductor substrate;
depositing a silicon nitride layer overlying said pad oxide layer;
depositing a polysilicon layer overlying said silicon nitride layer;
depositing an oxidation mask overlying said polysilicon layer;
patterning said oxidation mask, said polysilicon layer, said silicon nitride layer, said pad oxide layer, and said silicon semiconductor substrate to form trenches for planned shallow trench isolations;
oxidizing said silicon semiconductor substrate exposed within said trenches to form an oxide liner layer within said trenches wherein said oxidation mask prevents oxidation of said polysilicon layer;
removing said oxidation mask;
depositing a trench oxide layer overlying said liner oxide layer and filling said trenches; and
polishing down said trench oxide layer and said polysilicon layer stopping at said silicon nitride layer wherein said polishing down is by a chemical mechanical polish using a polishing slurry having a polishing selectivity of oxide to polysilicon to nitride of 4:100:1 to complete said shallow trench isolations in the manufacture of said integrated circuit device.

15. The method according to claim 14 wherein said silicon nitride layer is deposited by chemical vapor deposition to a thickness of between about 800 and 2000 Angstroms.

16. The method according to claim 14 wherein said polysilicon layer is deposited to a thickness of between about 500 and 1000 Angstroms.

17. The method according to claim 14 wherein said oxidation mask comprises silicon nitride deposited by chemical vapor deposition to a thickness of between about 200 and 800 Angstroms.

18. The method according to claim 14 wherein said step of oxidizing said silicon semiconductor substrate forms said liner oxide layer having a thickness of between about 100 and 300 Angstroms.

19. The method according to claim 14 wherein said step of removing said oxidation mask comprises a wet etch before said step of depositing said trench oxide layer.

20. The method according to claim 14 wherein said oxidation mask is removed during said polishing down process.

21. The method according to claim 14 wherein said step of depositing said trench oxide layer comprises high density plasma chemical vapor deposition (HDP-CVD) of silicon oxide.

22. The method according to claim 14 wherein said trench oxide layer takes on a concave formation when said polysilicon layer is polished and wherein after said all of said polysilicon layer is removed an overpolishing flattens said trench oxide layer.

23. The method according to claim 14 wherein said chemical mechanical polishing uses a slurry comprising one of the group of: the combination of NH$_4$OH, silica abrasive, and de-ionized water and the combination of potassium hydroxide, silica abrasive, and de-ionized water; and wherein said chemical mechanical polishing process pad comprises polyurethane.

24. A method to form shallow trench isolations in the manufacture of an integrated circuit device comprising:
providing a silicon semiconductor substrate;
forming a pad oxide layer overlying said silicon semiconductor substrate;
depositing a silicon nitride layer overlying said pad oxide layer;
depositing a polysilicon layer overlying said silicon nitride layer;
depositing an oxidation mask overlying said polysilicon layer;
patterning said oxidation mask, said polysilicon layer, said silicon nitride layer, said pad oxide layer, and said silicon semiconductor substrate to form trenches for planned shallow trench isolations;
oxidizing said silicon semiconductor substrate exposed within said trenches to form an oxide liner layer within said trenches wherein said oxidation mask prevents oxidation of said polysilicon layer;
thereafter removing said oxidation mask;
depositing a trench oxide layer overlying said liner oxide layer and filling said trenches wherein said trench oxide layer comprises high density plasma silicon dioxide; and
polishing down said trench oxide layer and said polysilicon layer stopping at said silicon nitride layer wherein said polishing down is by a chemical mechanical polish having a polishing selectivity of oxide to polysilicon to nitride of 4:100:1 wherein said trench oxide layer takes on a concave formation when said polysilicon layer is polished and wherein after said all of said polysilicon layer is removed an overpolishing flattens said trench oxide layer to complete said shallow trench isolations in the manufacture of said integrated circuit device.

25. The method according to claim 24 wherein said silicon nitride layer is deposited by chemical vapor deposition to a thickness of between about 800 and 2000 Angstroms.

26. The method according to claim 24 wherein said polysilicon layer is deposited by chemical vapor deposition to a thickness of between about 500 and 1000 Angstroms.

27. The method according to claim 24 wherein said oxidation mask comprises silicon nitride deposited by chemical vapor deposition to a thickness of between about 200 and 800 Angstroms.

28. The method according to claim 24 wherein said step of oxidizing said silicon semiconductor substrate forms said liner oxide layer having a thickness of between about 100 and 300 Angstroms.

29. The method according to claim 24 wherein said step of removing said oxidation mask comprises a wet etch before said step of depositing said trench oxide layer.

30. The method according to claim 24 wherein said oxidation mask is removed during said polishing down process.

31. The method according to claim 24 wherein said chemical mechanical polishing uses a slurry comprising one of the group of: the combination of $NH_4OH$, silica abrasive, and de-ionized water and the combination of potassium hydroxide, silica abrasive, and de-ionized water; and wherein said chemical mechanical polishing process pad comprises polyurethane.

* * * * *